United States Patent [19]

Hinton

[11] 4,280,095
[45] Jul. 21, 1981

[54] EXTREMELY SENSITIVE SUPER CONDUCTING QUANTUM INTERFERENCE DEVICE CONSTRUCTED AS A DOUBLE-HELIX ARRAY

[75] Inventor: George F. Hinton, Pass Christian, Miss.

[73] Assignee: The United States of America as represented by the Secretary of the Navy, Washington, D.C.

[21] Appl. No.: 22,764

[22] Filed: Mar. 22, 1979

[51] Int. Cl.³ .................... G01R 33/035; H01L 39/22
[52] U.S. Cl. ........................ 324/248; 29/599; 357/5
[58] Field of Search ............. 324/248; 307/306, 212; 357/5; 29/599; 336/DIG. 1, 226, 231

[56] References Cited

U.S. PATENT DOCUMENTS

| | | | |
|---|---|---|---|
| 3,259,844 | 7/1966 | Casimir | 307/306 X |
| 3,504,283 | 3/1970 | Meservey | 307/306 X |
| 3,528,005 | 9/1970 | Morse et al. | 324/248 |
| 3,549,991 | 12/1970 | Silver et al. | 324/248 |
| 3,956,690 | 5/1976 | Rorden | 324/248 |
| 3,965,411 | 6/1976 | Hesterman | 324/248 X |

OTHER PUBLICATIONS

Harris et al., "Superconducting Microcircuitry—Using Ion Implantation", IBM Tech. Discl. Bull., vol. 17, No. 1, Jun. 1974, pp. 257, 258.
Harris et al., "Production of Weak Links—by Ion Implantation", IBM Tech. Discl. Bull., vol. 17, No. 9, Feb. 1975, pp. 2793, 2794.

Primary Examiner—Gerard R. Strecker
Attorney, Agent, or Firm—R. S. Sciascia; Charles D. B. Curry; George L. Craig

[57] ABSTRACT

The instant invention increases the sensitivity of Josephson Junction Cryogenic Magnetometers by the use of stacked SQUID arrays. The SQUID sensitivity at each sensing point is increased by making an intimate, co-axial superposition of two or more two-junction DC SQUID loops, using evaporated thin-film technology although fabrication is not limited to this technology. The device permits multiple use of the SQUID loop area, thereby increasing the sensing volume and improving the coupling to the ambient magnetic field.

4 Claims, 5 Drawing Figures

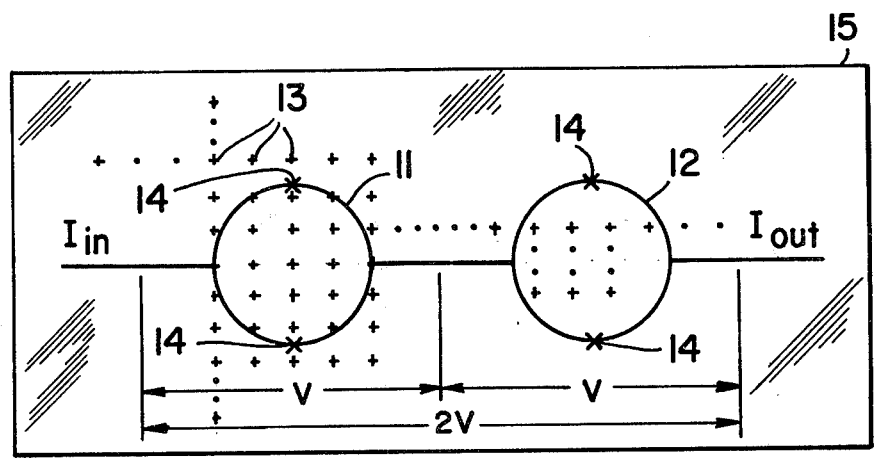
FIG_1 (PRIOR ART)
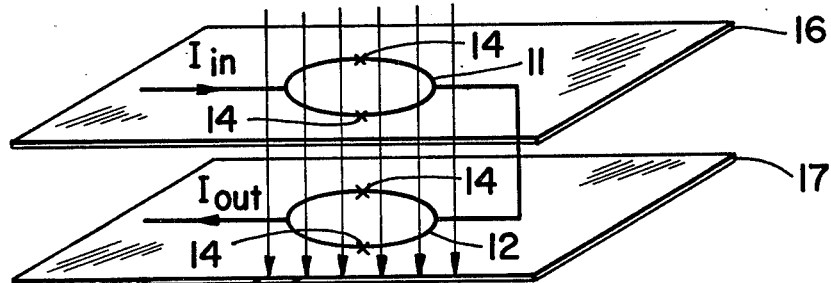
FIG_2
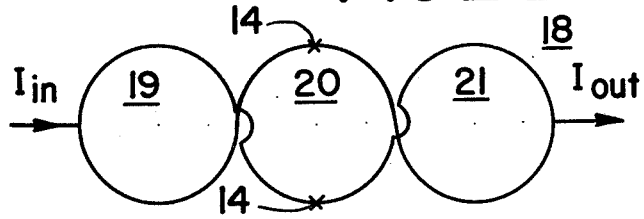
FIG_3a
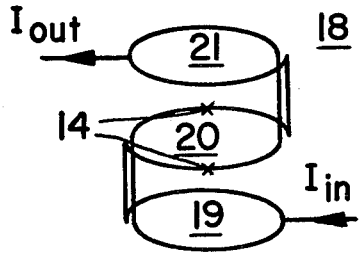
FIG_3b
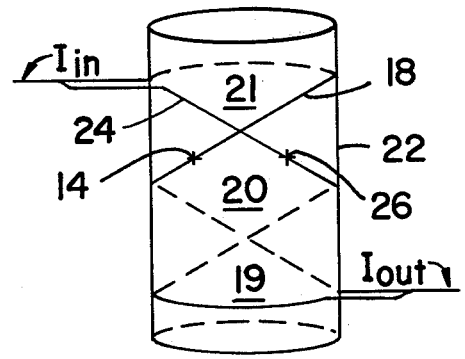
FIG_4

EXTREMELY SENSITIVE SUPER CONDUCTING QUANTUM INTERFERENCE DEVICE CONSTRUCTED AS A DOUBLE-HELIX ARRAY

BACKGROUND OF THE INVENTION

1. Field of the Invention

The invention pertains to a construction technique for a new and improved electromagnetic measuring system. In particular, the invention describes a technique for greatly increasing the sensitivity while reducing the size of Josephson Junction Cryogenic Magnetometers.

2. Description of Prior Art

Cryogenic magnetometry is a new but rapidly developing field of technology. Although the sensing device itself can be made quite small, it is designed to function at temperatures a few degrees above absolute zero and so must be operated within large bulky Dewars containing liquid helium coolant. The operation of the devices depends on the effect of an applied magnetic field upon the superconducting properties of Josephson Junctions. A Josephson Junction is commonly described as a 'weak link' or tiny barrier separating two bulk superconductors and may be a dielectric barrier on the order of 50A° thick, a tiny constriction or a point contact. The amplitude of the supercurrent across the junction is a function of the quantum mechanical phase difference between the Cooper pair electron wave functions across the junction, and the phase difference is, in turn, dependent on the applied magnetic field. Application of these effects in magnetometry has followed two main lines of development. The most highly developed system is the single junction RF superconducting quantum interference device or SQUID. This device is equivalent to a superconducting ring having a single weak link coupled to a resonant circuit driven by a constant current source at a selected RF frequency. Both the Q-factor and the resonant frequency of the circuit are modified by the coupling to the SQUID dependent upon the magnetic flux through the ring. The other line of development is the two-junction DC SQUID in which a superconducting loop incorporates two junctions in parallel. For the DC SQUID, the maximum supercurrent across the device, the critical current, is a periodic function of the magnetic flux enclosed in the loop. A DC SQUID is usually operated in a resistive mode at constant current in which the total current is due in part to superconducting electrons and in part to normal electrons. A voltage signal is then picked off a convenient operating point of the corresponding current-voltage curve. Changes in this voltage are a function of changes in the magnetic flux contained within the loop. The described invention is a DC SQUID.

A further problem is that instruments for measuring magnetic fields are generally bulky and complex, especially where the magnetic field or magnetic field gradient is very minute. A SQUID is essentially a vector instrument and thus sensitive to rotation. However, complex, multi-SQUID arrays, each SQUID in the array separated by some distance from other SQUIDS in the array and mounted on a rigid substrate, can theoretically be made insensitive to rotation and used to measure magnetic field gradients, curvatures and other higher-order derivatives of the field. Large arrays, however, become impractical very quickly due to the size and weight of the Dewars necessary to contain the liquid helium. If the sensitivity of a conventional SQUID were to be increased by a facor of two, the volume and weight of a gradiometer comprised of three mutually orthogonal SQUID arrays could be decreased by a factor of eight for sensitivity equivalent to a larger conventional array. Significant advances in inreasing the sensitivity of SQUIDS would yield advances in instrumentation arts of great importance.

Yet another limitation possessed by conventional magnetometer construction is that conventional SQUIDS themselves generate magnetic fields or, in some instances, disturb the applied magnetic field such that a plurality of SQUIDS arrayed in close proximity to one another experience mutual interference as the result of positive coupling (mutual inductance). Thus most prior art devices use only single loop SQUIDS. The described invention allows closely packed multiple loop SQUID arrays yielding much greater sensitivity in far less volume with negative noise coupling and subsequently decreased mutual interference or noise signal voltages.

SUMMARY OF THE INVENTION

The described invention is briefly summarized as a means for increasing the sensitivity of Josephson Junction Cryogenic Magnetometers by unique design and construction of DC SQUID arrays. The SQUIDS are arrayed vertically and the sensitivity of each sensing point is increased by making an intimate, co-axial superposition of two or more two-junction SQUID loops using, for example, evaporated thin-film technology although fabrication is not limited solely to this technique. The device permits multiple SQUID loops to enclose the same applied magnetic flux thereby increasing the sensing volume and improving the coupling to the applied magnetic field.

A primary object of invention is to provide a magnetometer of greatly reduced size, greatly increased sensitivity, and the capability to measure higher-order derivatives of magnetic fields.

A further object of invention is to provide a magnetic sensing device employing a plurality of DC SQUID loops, each enclosing the same magnetic flux and a method for reducing such a device.

BRIEF DESCRIPTION OF THE DRAWINGS

FIG. 1 shows two coplanar DC SQUID loops connected in series.

FIG. 2 shows two vertically stacked coaxial DC SQUID loops.

FIGS. 3a, 3b show two interleaved single-helix DC SQUID coils forming a double-helix coaxial SQUID loop array.

FIG. 4 shows a double-helix array surrounding a solid magnetic flux path.

DESCRIPTION OF THE PREFERRED EMBODIMENT

Referring to FIG. 1, two identical, two-junction SQUID loops 11, 12 are connected in series in a co-planar configuration in a homogeneous magnetic field 13 normal to the plane of the loops. The Josephson Junctions or weak links 14 are represented by X's. The loops 11, 12 are mounted on a dielectric or non-conducting substrate 15. The loops 11, 12 are operated in a current bias or resistive mode and the voltage drop, V, across each loop implies that for n loops the total voltage drop is nV. Noise voltages in the loops, due to equilibrium temperature fluctuations in the junctions 14, are uncorrelated and total noise will therefore increase by a factor of $\sqrt{n}$ for n loops. Thus, neglecting inductive coupling, the sensitivity of such a co-planar array will also increase by a factor of $\sqrt{n}$ for n loops and the area will increase by a factor of n assuming close packing. Large arrays of this type are soon limited by the size of the associated Dewar required.

Referring to FIG. 2, the unique aspects of the described device over prior art are shown. A first SQUID loop 11, as in FIG. 1, is formed using evaporated thin film technology, for example, on a first film 16 and a second SQUID loop 12 is formed in a similar manner on a second film 17. The two loops are then series connected and arrayed in an intimate coaxial structure perpendicular to the applied magnetic field 13. The structure has the approximate thickness of the two combined loops but a surface area of only one loop. The total inductance of two loops in series is given by:

$$L = L_{11} + L_{12} \pm 2M = L_{11} + L_{12} 30\ 2k\sqrt{L_{11}L_{12}}$$

where
  $L_{11}$ = inductance of loop 11
  $L_{12}$ = inductance of loop 12
  M = mutual inductance of loops 11 and 12 and may be positive or negative depending on the manner of coupling.
  k = coupling constant where $-1 \leq k \leq +1$ For such an array as shown in FIG. 2, k is positive for signal voltage calculations and may approach $+1$ for the closely packed structure resulting in L approaching $n^2L$ for an n loop coaxial array. The signal voltage would therefore approach $n^2$ for an intimate coaxial array of n loops. It is of great importance that in such a coaxial array as shown in FIG. 2 the coupling constant k for noise voltage calculations is negative. This occurs because the thermal fluctuations in the junctions 14 of each of the loops 11, 12 are equivalent to separate, uncorrelated little generators driving small electric currents around their respective loops. These noise currents each have an associated noise flux which links with the adjacent loop and induces an opposing flux. Thus the negative constant k approaches $-1$ for the structure shown resulting in a vanishingly small total inductance for the noise voltage calculations. In conventional SQUID manufacture, single loop SQUIDS are made extremely small, approximately 3 millimeters in diameter, to minimize loop inductance since inductance decreases proportionately with decreasing loop area. The intimate coaxial array of FIG. 2 is not subject to this constraint because of the negative coupling. Therefore, such arrays can be made substantially larger with correspondingly larger signal voltages but without correspondingly large increases in noise voltage. This permits much less expensive manufacture of such devices since tolerance problems are greatly diminished.

The intimate, coaxial stack of this film SQUIDS shown in FIG. 2 may be either series connected allowing great signal voltage sensitivity or parallel connected, in which case signal currents add, allowing great signal current sensitivity. Obviously the array of coaxial loops need not be limited to only two. An array of n loops, each having two junctions and connected in series or in parallel may be 'fan-folded' to produce the intimate coaxial stack having specific design sensitivity for any desired application.

An alternative construction of the intimate coaxial array of FIG. 2 in which the number of junctions is greatly reduced is highly desirable since the concomitant tolerance problem of manufacturing and matching the junctions 14 of the various loops is greatly minimized. Referring to FIG. 3a, an extended SQUID loop 18 having two junctions 14 is shown twisted to form three loops 19, 20 and 21 all having the same area. Loops 19 and 21 are of the same current sense and are opposite to the current sense of loop 20. Referring to FIG. 3b, loop 21 is folded on top of loop 20 and loop 19 is folded below loop 20 creating a double helix having three loops, two junctions and all loops having the same current sense. This double helix 18 of intimate coaxial loops 19, 20, 21 will produce both high signal voltage and high noise voltage due to the thermal fluctuation currents now series connected in this coil. If a second double helix, not shown, having the same number of loops is constructed and coaxially intermeshed with the first double helix, the coupling constant, k, between the two double helices is positive for the signal and negative for the noise, resulting in great enhancement of the signal voltage and great diminution of the noise voltage. The effect is as if each loop 11, 12 of FIG. 2 were replaced by a double helix 18 of FIG. 3b and the four helices were intimately, coaxially intermeshed. The additional advantage of the structure described is that the sensitivity and compactness advantages of an n loop, intimately stacked, coaxial SQUID array can be achieved using only 4 junctions.

A practical manner of construction of such an array, as described above, will now be given. Although the following descriptive example uses a cylinder as a core, other geometrical shapes may be used as a flux core so long as cross section area is uniform along one body axis parallel to the applied magnetic field. Referring to FIG. 4, a cylinder 22 of quartz or silicon, for example, acts as a magnetic flux path. The cylinder 22 has scribed into its surface a first helical groove 18. A ruling engine, for example, such as is used to make diffraction gratings could scribe the surface of the cylinder 22 forming the helical groove 18 with very close packing of turns. A thin film of a superconducting material such as niobium, for example, is then evaporatively deposited on and polished off of the cylindrical surface 22 leaving a niobium electrical conductingpath within the helical groove 18. A Josephson Junction 14 is then constructed or attached at an appropriate point, probably the midpoint of the helical groove 18. The surface of the cylinder 22 is then coated with some insulating material, not shown, and a second single helical groove 24 scribed into the insulating material. The second helical groove 24 has depth less than the thickness of the insulating material and the same pitch although of reverse sense as the first helical groove 18. A thin film of niobium is deposited over the layer of insulating material and polished off leaving another niobium electrical conducting path, this in the second helical groove 24. Another Josephson Junction 26 is constructed or attached at an appropriate point, probably near the midpoint of the second helical groove 24. The surface of the cylinder 22 is then coated with a second layer of insulating material, not shown. The two helices 18,24 are then electrically connected at the points $I_{in}$ and $I_{out}$ of FIG. 4 forming a double helix that is one-half of the array under construction. A third helical groove, not shown, having the same pitch as the first two grooves and the same sense as groove 18 is then scribed into the second layer of insulating material similar to the scribing of groove 24 and the steps of depositing niobium, polishing off the niobium, attaching a Josephson Junction near the midpoint of the third niobium-filled groove and coating the cylindrical surface with a layer of insulating material are repeated. A fourth helical groove, not shown, having the same pitch as the preceding grooves and the same sense as groove 24 is scribed into the third layer of insulating material similar to the scribing of the third groove and groove 24 and the steps of depositing niobium, polishing off the niobium, attaching a Josephson Junction near the mid-point of the fourth niobium-filled groove and coating the cylindrical surface with a layer of insulating material are repeated. The third and fourth helices are then electrically connected at two points $I'_{in}$ and $I'_{out}$, similar to those of helices 18 and 24, and the SQUID array under construction is one of two intimately, coaxially intermeshed double helices having n loops, 4 Josephson Junctions, negative noise coupling between the two double helix components of the array and greatly enhanced signal sensitivity. The two double helices are electrically connected in either series or parallel fashion. For series connection, $I_{out}$ for the double helix of the first two grooves becomes $I'_{in}$ for the double helix of the second two grooves. For parallel connection, $I_{in}$ and $I_{out}$ are common for the two double helices formed by the four grooves. Note that although FIG. 4 shows only three turns per groove, the actual number of turns per groove is one of design choice.

For the described intimately stacked coaxial SQUID arrays, several other advantages over the prior art result. Field amplification is cascaded such that if the array sensitivity is increased by n and the magnetic susceptibility of the quartz or silicon cylinder enhanced by m, the total signal enhancement is $n \times m$. Note only one such cylinder is used rather than many as would be needed for a co-planar array where a cylinder would be required for each loop. Further, enhancement of sensitivity of the coaxial SQUID array may be so great as to permit dispensing with the quartz or silicon core for most applications, resulting in yet smaller magnetometer systems. Still further, single loop SQUID arrays of prior art are adversely affected by high frequency radio or radar emanations. The distrubuted capacitence between the turns of the described invention will greatly minimize this source of signal interference.

What is claimed is:

1. A SQUID array device comprising:
   (a) a solid flux path of constant cross-section area along one body axis having a first groove with an upper and a lower end and having very close turns scribed into the surface of said flux path about said body axis;
   (b) a first conducting material deposited in said first groove;
   (c) a first Josephson Junction attached at some point on said first groove;
   (d) a first layer of non-conducting material uniformly deposited over the surface of said flux path;
   (e) a second groove having an upper and a lower end and having very close turns scribed into the surface of said first layer of non-conducting material, said second groove having depth less than the thickness of said first layer of non-conducting material, pitch similar to that of said first groove and sense opposite that of said first groove such that said turns of said first groove and said turns of said second groove are intermeshed and coaxially aligned;
   (f) a second conducting material deposited in said second groove;
   (g) a second Josephson Junction attached at some point on said second groove;
   (h) a second layer of non-conducting material uniformly deposited over the surface of said flux path;
   (i) a third groove having an upper and a lower end and having very close turns scribed into the surface of said second layer of non-conducting material, said third groove having depth less than the thickness of said second layer of non-conducting material, pitch similar to that of said first and said second groove and sense similar to that of said first groove such that said turns of said third groove are intermeshed and coaxially aligned with said turns of said second groove;
   (j) a third conducting material deposited in said third groove;
   (k) a third Josephson Junction attached at some point on said third groove;
   (l) a third layer of non-conducting material uniformly deposited over the surface of said flux path;
   (m) a fourth groove having an upper and a lower end and having very close turns scribed into the surface of said third layer of non-conducting material, said fourth groove having depth less than the thickness of said third layer of non-conducting material, pitch similar to that of said first, second and third grooves and sense opposite that of said third groove such that said turns of said fourth groove are intermeshed and coaxially aligned with said turns of said third groove;
   (n) a fourth conducting material deposited in said fourth groove;
   (o) a fourth Josephson Junction attached at some point on said fourth groove;
   (p) a fourth layer of non-conducting material uniformly deposited over the surface of said flux path;
   (q) first means for connecting said upper and said lower ends of said first groove to respective said upper and said lower ends of said second groove forming a first double groove array;
   (r) second means for connecting said upper and said lower ends of said third groove to respective said upper and said lower ends of said fourth groove forming a second double groove array; and
   (s) third means for connecting said first and said second double groove arrays.

2. A SQUID array device as recited in claim 1 wherein said flux path is a quartz cylinder.

3. A SQUID array device as recited in claim 1 wherein said flux path is silicon cylinder.

4. A SQUID array device as recited in claims 2 or 3 wherein said first, said second, said third and said fourth conducting materials are niobium.

* * * * *